United States Patent
Ge et al.

(10) Patent No.: US 11,025,159 B2
(45) Date of Patent: Jun. 1, 2021

(54) CONTROL OF DIRECT PARALLEL AUTOMOTIVE SWITCHES FOR POWER CONVERTERS TO SELECTIVELY PREVENT ACTIVATION THEREOF

(71) Applicant: Ford Global Technologies, LLC, Dearborn, MI (US)

(72) Inventors: Baoming Ge, Okemos, MI (US); Lihua Chen, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/676,211

(22) Filed: Nov. 6, 2019

(65) Prior Publication Data

US 2021/0135564 A1    May 6, 2021

(51) Int. Cl.
| | |
|---|---|
| *H02M 1/38* | (2007.01) |
| *H02M 1/088* | (2006.01) |
| *H03K 17/687* | (2006.01) |
| *H03K 17/60* | (2006.01) |
| *H02M 7/5387* | (2007.01) |

(52) U.S. Cl.
CPC ............ *H02M 1/38* (2013.01); *H02M 1/088* (2013.01); *H03K 17/602* (2013.01); *H03K 17/6871* (2013.01); *H02M 7/5387* (2013.01); *H02M 7/53871* (2013.01)

(58) Field of Classification Search
CPC ................... H02M 1/38; H02M 1/088; H02M 2001/0009; H02M 2001/0048; H02M 7/5387; H02M 7/53871; H03K 17/602; H03K 17/6871

See application file for complete search history.

(56) References Cited

U.S. PATENT DOCUMENTS

| | | | |
|---|---|---|---|
| 4,126,819 A * | 11/1978 | Stobbe ................... | H02M 1/092 318/798 |
| 6,678,180 B2 * | 1/2004 | Matsuda .................. | H02M 1/38 318/810 |
| 9,484,908 B1 | 11/2016 | Lu et al. | |
| 9,762,114 B2 | 9/2017 | Lyle et al. | |
| 9,793,792 B2 | 10/2017 | Forscht et al. | |
| 2006/0285372 A1 * | 12/2006 | Ozaki ............... | H02M 7/53871 363/56.03 |
| 2012/0194114 A1 * | 8/2012 | Ito ........................... | H02P 7/285 318/434 |
| 2014/0146574 A1 * | 5/2014 | Worek .............. | H02M 3/33507 363/17 |

* cited by examiner

*Primary Examiner* — Jeffrey A Gblende
*Assistant Examiner* — Lakaisha Jackson
(74) *Attorney, Agent, or Firm* — David B. Kelley; Brooks Kushman P.C.

(57) ABSTRACT

An automotive power converter includes positive and negative DC rails, a pair of phase legs each having first and second switches connected in series, an output electrically connected between the first and second switches of each of the phase legs, and control circuitry configured to prevent turn on of the first switches responsive to current through either of the second switches exceeding a predefined threshold.

11 Claims, 3 Drawing Sheets

CONTROL OF DIRECT PARALLEL AUTOMOTIVE SWITCHES FOR POWER CONVERTERS TO SELECTIVELY PREVENT ACTIVATION THEREOF

TECHNICAL FIELD

This disclosure relates to automotive power converters, such as DC-AC inverters/rectifiers and DC-DC converters of electric drive systems.

BACKGROUND

Electrified vehicles, including hybrid, plug-in hybrid, and electric vehicles, are designed to be propelled or partially propelled by one or several electric machines, such as AC induction machines, DC brushless electric machines, or permanent magnetic synchronous machines. Battery packs may be included in the electrified vehicles to provide electricity to the electric machines. Hybrid and plug-in hybrid vehicles may also have built-in internal combustion engines, which are able to charge the battery packs and/or propel the electrified vehicles. The battery pack includes multiple battery cells in series and/or in parallel to achieve high voltage and/or high output power to meet the requirements of the electric machines. The battery packs also provide power to other equipment and circuits, such as DC-DC converters, DC-AC inverters, on-board generators, and air conditioning systems.

SUMMARY

An automotive power converter includes positive and negative DC rails, a pair of phase legs each having first and second switches connected in series, an output electrically connected between the first and second switches of each of the phase legs, and control circuitry configured to prevent turn on of the first switches responsive to current through either of the second switches exceeding a predefined threshold. The first switches are directly electrically connected with the positive DC rail and directly electrically connected in parallel. The second switches are directly electrically connected with the negative DC rail and directly electrically connected in parallel;

A method for controlling an automotive power converter including a pair of paralleled phase legs each having first and second switches connected in series, and an output electrically connected between the first and second switches of each of the phase legs, wherein the first switches are directly electrically connected in parallel, and the second switches are directly electrically connected in parallel, the method includes generating for each of the first and second switches a current signal indicative of a magnitude of current flowing through the switch, generating for each of the first and second switches a state signal, wherein the state signal is low responsive to the corresponding current signal exceeding a threshold, and the state signal is high otherwise, and generating for each of the first and second switches an input control signal. The method further includes generating driver command signals for gate drivers of the first switches that have high values to activate the gate drivers of the first switches responsive to the state signals of the second switches being high and the input control signal for the first switches being high, and generating driver command signals for the gate drivers of the first switches that have low values to prevent activation of the gate drivers of the first switches responsive to one or both of the state signals of the second switches being low regardless of whether the input control signal for the first switches is high or low.

An automotive power converter includes a pair of paralleled phase legs each having first and second switches connected in series, wherein the first switches are directly electrically connected in parallel, and the second switches are directly electrically connected in parallel, and wherein each of the first and second switches has an integrated current sensor configured to generate a current signal indicative of a magnitude of current flowing through the switch. The automotive power converter further includes an output electrically connected between the first and second switches of each of the phase legs, circuitry configured to generate for each of the first and second switches a state signal that is low responsive to the corresponding current signal exceeding a threshold, and is high otherwise, and a plurality of AND gates. The plurality of AND gates generate for the second switches a first aggregate signal that is high responsive to the state signals for the second switches being high, and is low otherwise, generate for the first switches driver command signals for gate drivers of the first switches that have high values to activate the gate drivers of the first switches responsive to the first aggregate signal being high and an input control signal for the first switches being high, and generate for the first switches driver command signals for the gate drivers of the first switches that have low values to prevent activation of the gate drivers of the first switches responsive to the first aggregate signal being low regardless of whether the input control signal for the first switches is high or low.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

High power electric drive (e-drive) systems are usually required to provide high torque and high dynamic response in electric vehicles (EVs) and Hybrid EVs (HEVs). Commercially available power devices qualified for automotive applications, however, may exhibit current limitations that limit inverter/converter power.

Paralleled phase legs can extend current capability, but circulating current and imbalanced current between paralleled phase legs are sometimes a concern. Consistent characteristics of power devices and gate drivers may be required to minimize these issues. There are challenges, however, within the context of mass production due to piece-to-piece variation of power devices, and gate drive circuits having different gate control propagation delays.

Figure 1:
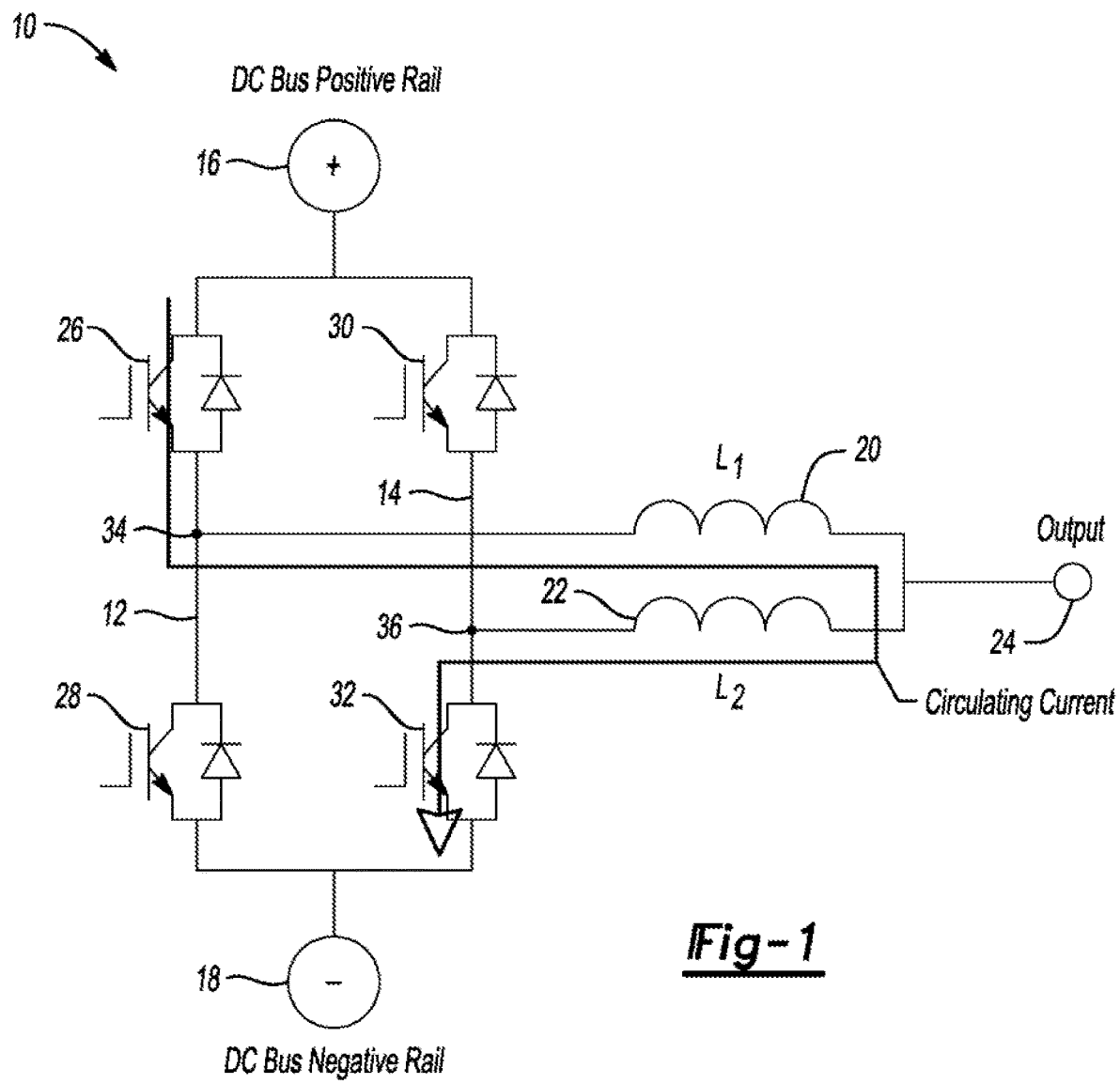
FIG. 1 is a schematic diagram of two phase legs in parallel through inductors.

To limit circulating current between phase legs, inductors are usually connected between them, and long dead time (the time during which none of the switches is turned on) may be required. FIG. 1, for example, shows a portion of an automotive power converter 10 that includes paralleled phase legs 12, 14, DC bus positive rail 16, DC negative rail 18, series connected inductors 20, 22, and output 24. The phase leg 12 includes series connected switches 26, 28. The phase leg 14 includes series connected switches 30, 32. The inductor 20 shares a terminal 34 with the switches 26, 28. The inductor 22 shares a terminal 36 with the switches 30, 32. The output 24 is connected between the inductors 20, 22. Inclusion of the inductors 20, 22, however, may increase the size of the corresponding electric drive system and thus may not be preferred for automotive applications.

Figure 2:
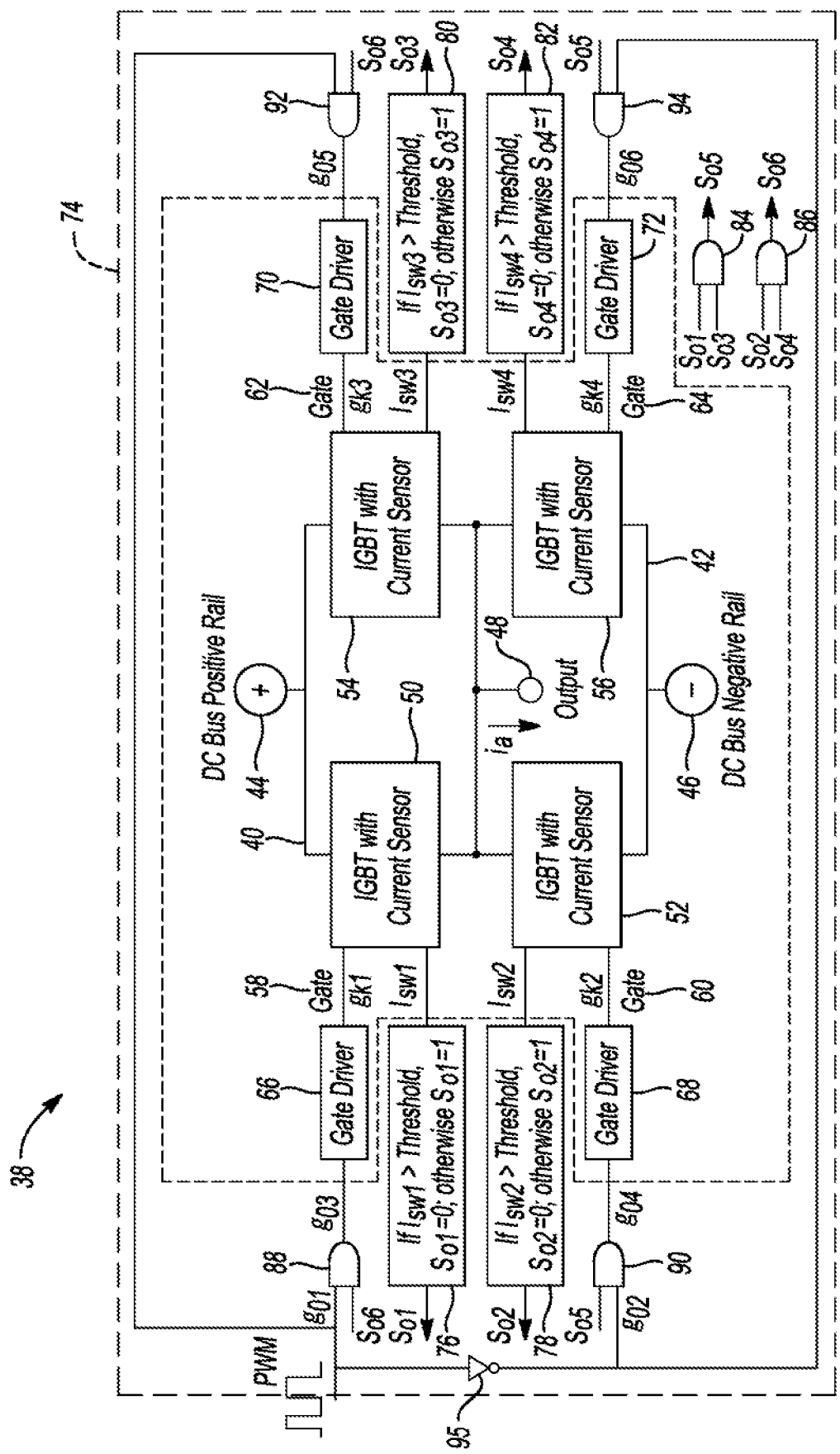
FIG. 2 is a schematic diagram of power devices in direct parallel.

Here, we propose arrangements of direct parallel power switches for voltage source inverters/converters in HEV/EV applications. FIG. 2 provides one such example. As will be apparent to those of ordinary skill, circulating current is eliminated without the use of inductors and dead time presetting is not necessary.

FIG. 2 shows a portion of an automotive power converter 38 that includes paralleled phase legs 40, 42, DC bus positive rail 44, DC negative rail 46, and output 48. The phase leg 40 includes series connected field effect transistors (e.g., integrated gate bipolar transistors (IGBTs)) with integrated current sensors 50, 52. The phase leg 42 includes series connected field effect transistors with integrated current sensors 54, 56. Each of the IGBTs 50, 52, 54, 56 has a corresponding gate 58, 60, 62, 64 and gate driver 66, 68, 70, 72. The IGBTs 50, 54 are directly connected in parallel, and the IGBTs 52, 56 are directly connected in parallel. As a result, the paralleled phase legs 40, 42 do not include inductors between them.

The DC bus positive rail 44 and DC negative rail 46 may be electrically connected with a DC link capacitor (DC bus) of a vehicle. This DC link capacitor may receive DC power from a variable voltage converter or the like electrically connected with a traction battery. The output 48 may be electrically connected with a phase of an electric machine arranged to propel the vehicle. Thus, the automotive power converter 38 may convert DC power from the DC bus to AC power for the electric machine. Likewise, the automotive power converter 38 may convert AC power from the electric machine (generated for example during regenerative braking) to DC power for the DC bus.

The power converter 38 also includes control circuitry 74. In the embodiment of FIG. 2, the control circuitry 74 is implemented as a series of logic elements. The control circuitry 74, however, in other embodiments may be implemented within a controller or microprocessor, etc., possibly separate from the power converter 38. That is, an independent controller(s) within the vehicle may be tasked with some/all the functions performed by the control circuitry 74. The control circuitry 74 in the example of FIG. 2 includes control blocks 76, 78, 80, 82 and logic blocks 84, 86, 88, 90, 92, 94, 95. In this example, the logic blocks 84, 86, 88, 90, 92, 94 are AND gates, and the logic block 95 is a NOT gate.

The gate signals corresponding to the gates 58, 60, 62, 64 are $g_{k1}$, $g_{k2}$, $g_{k3}$, $g_{k4}$. The current signals corresponding with the integrated current sensors of the IGBTs 50, 52, 54, 56 are $I_{SW1}$, $I_{SW2}$, $I_{SW3}$, $I_{SW4}$. Each of the current signals $I_{SW1}$, $I_{SW2}$, $I_{SW3}$, $I_{SW4}$ is respectively compared with a threshold value, $I_{th}$, (e.g., 10 A or less) at the control blocks 76, 78, 80, 82. The resulting state signals $S_{o1}$, $S_{o2}$, $S_{o3}$, $S_{o4}$ take on binary values as follows:

$$S_{o1} = \begin{cases} 1, I_{sw1} \leq I_{th} \\ 0, I_{sw1} > I_{th} \end{cases}, S_{o2} = \begin{cases} 1, I_{sw2} \leq I_{th} \\ 0, I_{sw2} > I_{th} \end{cases}, \quad (1)$$

$$S_{o3} = \begin{cases} 1, I_{sw3} \leq I_{th} \\ 0, I_{sw3} > I_{th} \end{cases}, S_{o4} = \begin{cases} 1, I_{sw4} \leq I_{th} \\ 0, I_{sw4} > I_{th} \end{cases}$$

The function (1) can be implemented, for example, by using a hardware and/or software comparator, or other methods. $S_{o1}$ and $S_{o3}$ are used to lock the lower two IGBTs 52, 56 at OFF state through aggregate signal $S_{o5}$. $S_{o2}$ and $S_{o4}$ are used to lock the upper two switches 50, 54 at OFF state through aggregate signal $S_{o6}$. That is, $S_{o5}$ will be high responsive to both $S_{o1}$ and $S_{o3}$ being high according to operation of the logic block 84. Otherwise, $S_{o5}$ will be low. Likewise, $S_{o6}$ will be high responsive to both $S_{o2}$ and $S_{o4}$ being high according to the logic block 86. Otherwise, $S_{o6}$ will be low.

The logic blocks 88, 92 receive an input control signal (e.g., a pulse width modulated (PWM) signal) $g_{o1}$, and respectively output gate driver command signals $g_{o3}$, $g_{o5}$. The logic blocks 90, 94 receive an input control signal $g_{o2}$, and respectively output gate driver command signals $g_{o4}$, $g_{o6}$. $g_{o2}$ is the inverse of $g_{o1}$ given the logic block 95. Responsive to $S_{o6}$ and $g_{o1}$ being high, $g_{o3}$ and $g_{o5}$ will be high, thus activating the gate drivers 66, 70. Responsive to $S_{o6}$ being low, $g_{o3}$ and $g_{o5}$ will be low regardless of whether $g_{o1}$ is high or low, thus preventing activation of the gate drivers 66, 70. Responsive to $S_{o5}$ and $g_{o2}$ being high, $g_{o4}$ and $g_{o6}$ will be high, thus activating the gate drivers 68, 72. Responsive to $S_{o5}$ being low, $g_{o4}$ and $g_{o6}$ will be low regardless of whether $g_{o2}$ is high or low, thus preventing activation of the gate drivers 68, 72. As such, this technique does not require dead-time pre-setting, and will eliminate circulating current and avoid shoot-through conditions even though the IGBTs 50, 54 and 52, 56 are directly in parallel.

Figure 3:
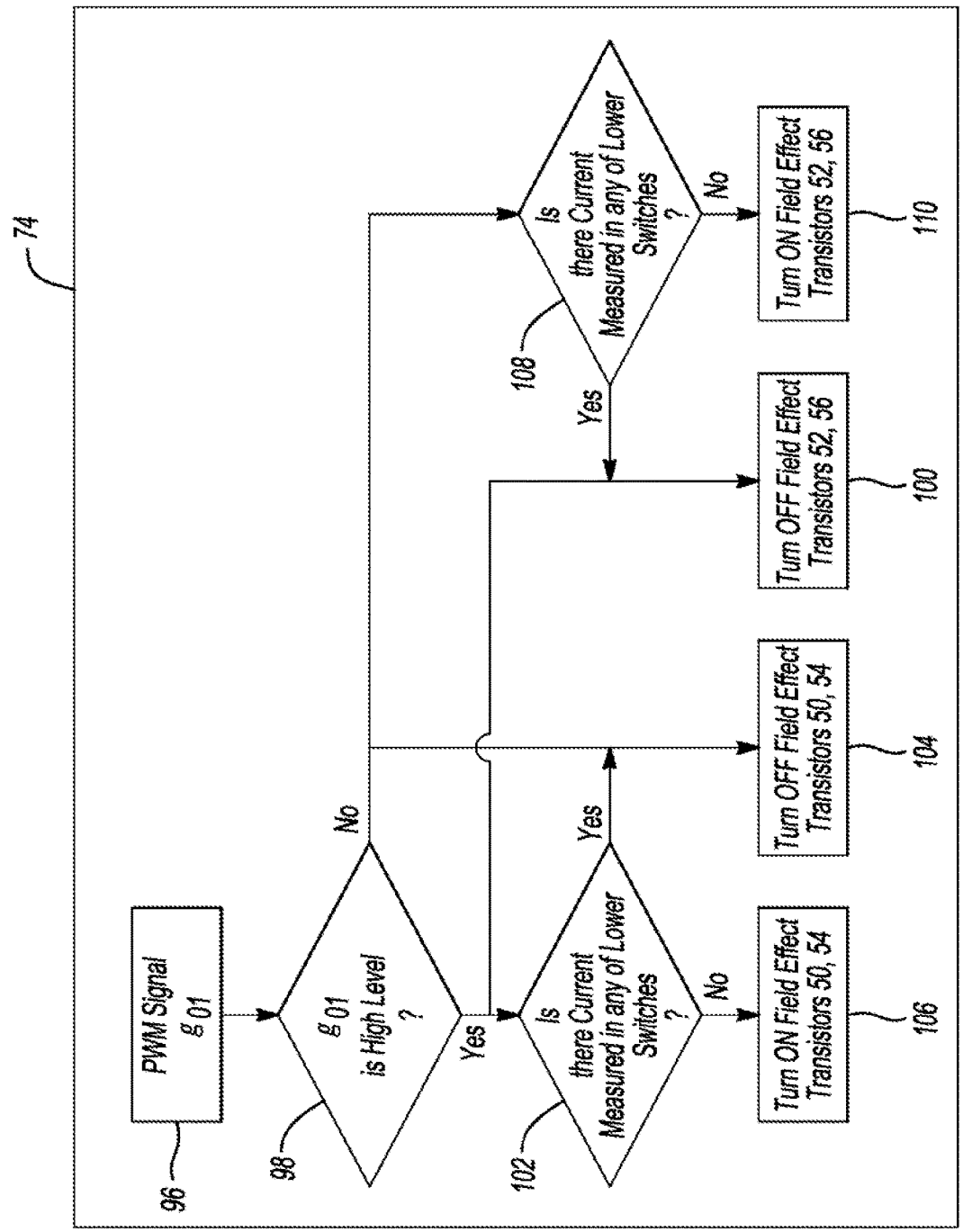
FIG. 3 is an algorithm for circulating current elimination.

FIG. 3 is a flow chart representation of the operations of FIG. 2. At block 96, the PWM signal, $g_{o1}$, is received. At operation 98, a check is performed to determine whether $g_{o1}$ is at a high level. If yes, the IGBTs 52, 56 are turned off at block 100, and a check is performed to determine whether there is current measured in any of the IGBTs 52, 56 at operation 102. If yes, the IGBTs 50, 54 are turned off at block 104. If no, the IGBTs 50, 54 are turned on at block 106. Returning to operation 98, if no, the IGBTs 50, 54 are turned off at block 104, and a check is performed to determine whether there is current measured in any of the IGBTs 52, 56 at operation 108. If yes, the IGBTs 52, 56 are turned off at block 100. If no, the IGBTs 52, 56 are turned on at block 110. Thus, one switch will not turn on if its command is OFF or any switch of opposite arm has current higher than the threshold. Otherwise, the switch turns on if its command is ON and both switches of the opposite arm have no current higher than the threshold.

The arrangement described above can be extended to three or more power devices in parallel, and the power switches can be IGBTs, metal oxide semiconductor field effect transistors (MOSFETs), or other active controlled switches. Other options are also contemplated.

The embodiments contemplated herein thus achieve direct parallel operation of power switches in voltage source inverters/converters. There is no inductor and no dead time presetting unlike certain existing solutions that employ inductors and presetting dead time to limit circulating current and avoid shoot-through conditions. Circulating current is also eliminated unlike certain existing techniques which can only limit circulating current within a range. Inverter output voltage can be ensured with low distortion and high voltage utilization. Dead time of some existing solutions results in inverter output voltage with high distortion and low voltage utilization. High robust performance against shoot through conditions due to feedback control of the switch current can be achieved.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method for controlling an automotive power converter including a pair of paralleled phase legs each having first and second switches connected in series, and an output electrically connected between the first and second switches of each of the phase legs, wherein the first switches are directly electrically connected in parallel, and the second switches are directly electrically connected in parallel, the method comprising:
    generating for each of the first and second switches a current signal indicative of a magnitude of current flowing through the switch;
    generating for each of the first and second switches a state signal, wherein the state signal is low responsive to the corresponding current signal exceeding a threshold, and the state signal is high otherwise;
    generating for each of the first and second switches an input control signal;
    generating driver command signals for gate drivers of the first switches that have high values to activate the gate drivers of the first switches responsive to the state signals of the second switches being high and the input control signal for the first switches being high; and
    generating driver command signals for the gate drivers of the first switches that have low values to prevent activation of the gate drivers of the first switches responsive to one or both of the state signals of the second switches being low regardless of whether the input control signal for the first switches is high or low.

2. The method of claim 1 further comprising generating driver command signals for gate drivers of the second switches that have high values to activate the gate drivers of the second switches responsive to the state signals of the first switches being high and the input control signal for the second switches being high.

3. The method of claim 2 further comprising generating driver command signals for gate drivers of the second switches that have low values to prevent activation of the gate drivers of the second switches responsive to one or both of the state signals of the first switches being low regardless of whether the input control signal for the second switches is high or low.

4. The method of claim 2, wherein the input control signal is a pulse width modulated signal.

5. The method of claim 2, wherein the input control signal for the second switches is an inverse of the input control signal for the first switches.

6. An automotive power converter comprising:
    a pair of paralleled phase legs each having first and second switches connected in series, wherein the first switches are directly electrically connected in parallel, and the second switches are directly electrically connected in parallel, and wherein each of the first and second switches has an integrated current sensor configured to generate a current signal indicative of a magnitude of current flowing through the switch;
    an output electrically connected between the first and second switches of each of the phase legs;
    circuitry configured to generate for each of the first and second switches a state signal that is low responsive to the corresponding current signal exceeding a threshold, and is high otherwise; and
    a plurality of AND gates configured to
        generate for the second switches a first aggregate signal that is high responsive to the state signals for the second switches being high, and is low otherwise,
        generate for the first switches driver command signals for gate drivers of the first switches that have high values to activate the gate drivers of the first switches responsive to the first aggregate signal being high and an input control signal for the first switches being high, and generate for the first switches driver command signals for the gate drivers of the first switches that have low values to prevent activation of the gate drivers of the first switches responsive to the first aggregate signal being low regardless of whether the input control signal for the first switches is high or low.

7. The automotive power converter system of claim 6, wherein the plurality of AND gates is further configured to generate for the first switches a second aggregate signal that is high responsive to the state signals for the first switches being high, and is low otherwise.

8. The automotive power converter system of claim 7, wherein the plurality of AND gates is further configured to generate for the second switches driver command signals for gate drivers of the second switches that have high values to activate the gate drivers of the second switches responsive to the second aggregate signal being high and an input control signal for the second switches being high.

9. The automotive power converter system of claim 7 wherein the plurality of AND gates is further configured to generate for the second switches driver command signals for gate drivers of the second switches that have low values to prevent activation of the gate drivers of the second switches responsive to the second aggregate signal being low regardless of whether an input control signal for the second switches is high or low.

10. The automotive power converter of claim 6, wherein the first and second switches are integrated gate bipolar transistors or metal oxide semiconductor field effect transistors.

11. The automotive power converter of claim 6, wherein the input control signal for the first switches is a pulse width modulated signal.

\* \* \* \* \*